(12) United States Patent
Bekke et al.

(10) Patent No.: US 9,730,334 B2
(45) Date of Patent: Aug. 8, 2017

(54) MOUNTING STRUCTURE OF LEADED ELECTRONIC COMPONENT WHICH REDUCES OCCURRENCE OF BLOW HOLE

(71) Applicant: FANUC Corporation, Minamitsuru-gun, Yamanashi (JP)

(72) Inventors: Makoto Bekke, Minamitsuru-gun (JP); Takeshi Sawada, Minamitsuru-gun (JP)

(73) Assignee: FANUC Corporation, Minamitsuru-gun, Yamanashi (JP)

( * ) Notice: Subject to any disclaimer, the term of this patent is extended or adjusted under 35 U.S.C. 154(b) by 0 days.

(21) Appl. No.: 15/138,354

(22) Filed: Apr. 26, 2016

(65) Prior Publication Data

US 2016/0324000 A1    Nov. 3, 2016

(30) Foreign Application Priority Data

Apr. 28, 2015   (JP) ................................. 2015-091266

(51) Int. Cl.
    *H05K 3/34*    (2006.01)
(52) U.S. Cl.
    CPC ......... *H05K 3/3415* (2013.01); *H05K 3/3468* (2013.01); *H05K 2201/10022* (2013.01);
    (Continued)
(58) Field of Classification Search
    CPC ..................... H05K 1/112; H05K 2201/10022
    See application file for complete search history.

(56) References Cited

U.S. PATENT DOCUMENTS

| | | | | |
|---|---|---|---|---|
| 3,610,811 A | * | 10/1971 | O'Keefe | ............... H05K 3/3452 |
| | | | | 174/262 |
| 5,811,736 A | * | 9/1998 | Lauffer | ................ H05K 3/0023 |
| | | | | 174/263 |

(Continued)

FOREIGN PATENT DOCUMENTS

| | | |
|---|---|---|
| JP | S53-24450 A | 3/1978 |
| JP | H01-171024 U | 12/1989 |

(Continued)

OTHER PUBLICATIONS

Notification of Reasons for Refusal issued Aug. 16, 2016 in Japanese Patent Application No. 2015-091266 (2 pages) with an English Translation (2 pages).

(Continued)

*Primary Examiner* — Hoa C Nguyen
(74) *Attorney, Agent, or Firm* — Drinker Biddle & Reath LLP

(57) ABSTRACT

In a leaded electronic component mounting structure in which the effect of reducing the occurrence of a blow hole is not impaired even if resin of a lead-inserted component is softened by heat during soldering and which can reduce a load placed on a lead when an external force acts, the lead of the lead-inserted component is inserted into a through hole provided in a base material of a printed wiring board, soldering is performed by immersing into molten solder, and a surface mount component and a surface mount component pad form an air vent tunnel. The air vent tunnel does not come into direct contact with the lead-inserted component, and therefore is not blocked even if the resin of the lead-inserted component softens due to soldering. Thus, the effect of reducing the occurrence of a blow hole is not impaired.

2 Claims, 5 Drawing Sheets

(52) U.S. Cl.
CPC .............. *H05K 2201/10515* (2013.01); *H05K 2203/1178* (2013.01)

(56) References Cited

U.S. PATENT DOCUMENTS

| | | | |
|---|---|---|---|
| 6,707,683 B1* | 3/2004 | Bravek | H05K 3/306 174/261 |
| 6,849,805 B2* | 2/2005 | Honda | H05K 3/3447 174/250 |
| 2003/0006061 A1* | 1/2003 | Brinthaupt, III | H05K 1/0201 174/255 |
| 2004/0078964 A1* | 4/2004 | Itou | H05K 3/3447 29/840 |
| 2007/0017699 A1* | 1/2007 | Ishimoto | H05K 3/306 174/260 |
| 2013/0016480 A1* | 1/2013 | Sun | H05K 1/115 361/720 |

FOREIGN PATENT DOCUMENTS

| | | |
|---|---|---|
| JP | H03-104773 U | 10/1991 |
| JP | H08-204323 A | 8/1996 |
| JP | H08-321668 A | 12/1996 |
| JP | H09-148705 A | 6/1997 |
| JP | H10-223802 A | 8/1998 |
| JP | 2005-302929 A | 10/2005 |
| JP | 2009-295812 A | 12/2009 |
| JP | 2012-104627 A | 5/2012 |
| WO | WO-2012/098573 A1 | 7/2012 |

OTHER PUBLICATIONS

Decision to Grant a Patent issued Jan. 17, 2017 in Japanese Patent Application No. 2015-091266 (3 pages) with an English Translation (3 pages).

* cited by examiner (BACKGROUND ART)

(BACKGROUND ART)

(BACKGROUND ART)

US 9,730,334 B2

MOUNTING STRUCTURE OF LEADED ELECTRONIC COMPONENT WHICH REDUCES OCCURRENCE OF BLOW HOLE

RELATED APPLICATION DATA

This application claims priority under 35 U.S.C. §119 and/or §365 to Japanese Application No. 2015-091266 filed Apr. 28, 2015, the entire contents is incorporated herein by reference.

BACKGROUND OF THE INVENTION

1. Field of the Invention

The present invention relates to a mounting structure which reduces the occurrence of a blow hole in a soldered portion due to the passage of air through a through hole when a lead-inserted component is electrically and mechanically connected to a printed wiring board by immersing into molten solder, the air being expanded in a space surrounded by the lead-inserted component and the printed wiring board.

2. Description of the Related Art

In a wiring board such as a printed wiring board, electrical and mechanical connection between an electronic component and the printed wiring board is made by inserting leads of the electronic component into through holes formed in the wiring board to attach the electronic component to the wiring board and soldering the leads to the through holes. It should be noted that a leaded electronic component is hereinafter referred to as a lead-inserted component. An example of the lead-inserted component is an electrolytic capacitor.

Generally, a lead-inserted component is mounted on a printed wiring board with a space left between a lower end portion of the lead-inserted component and the printed wiring board. However, when a lead and a through hole are joined with a space left between the lower end portion of the lead-inserted component and a mounting surface of the printed wiring board, if the lead-inserted component has a certain amount of weight, the joint is subjected to loading and vibration, and cracking may occur in the joint to reduce the reliability of solder joint.

Conversely, if the lead-inserted component is mounted on the printed wiring board such that the lower end portion of the lead-inserted component contacts the mounting surface to reduce loading and vibration on the joint, a closed space surrounded by the surface of the printed wiring board and the lower end portion of the lead-inserted component may be formed at the time of soldering performed by immersing the lead-inserted component into molten solder. When soldering is performed in that state, air in the closed space is thermally expanded, and the expanded air exits to the outside while pushing, out of the through hole, part of solder which has filled the through hole once. As a result of the solder being pushed out of the through hole, a blow hole is formed in the soldered portion to reduce the reliability of solder joint.

FIGS. 4A to 4C are diagrams for explaining the mechanism of formation of a blow hole. FIG. 4A is a diagram showing that a lead-inserted component 10 and a printed wiring board (base material 15 covered with solder resist 16) contact each other at a contacting portion 21 and that a hermetically closed space 20 is formed over a through hole 26 when soldering is performed. FIG. 4B is a diagram showing that heat generated during soldering increases the temperature of air in the above-described hermetically closed space 20 to increase the internal pressure of the hermetically closed space 20. FIG. 4C is a diagram showing that after soldering is performed, air in the hermetically closed space 20 exits through the through hole 26 to form a blow hole 22.

In the case where soldering is performed by immersing into molten solder a surface of the printed wiring board that is opposite to the surface thereof on which the lead-inserted component 10 and the printed wiring board contact each other, air in the hermetically closed space 20 is thermally expanded by the heat of the molten solder as shown in FIG. 4B. The expanded air flows into the through hole 26 and exits to the outside through the through hole 26 as shown in FIG. 4C to form the blow hole 22. Thus, the reliability of solder joint is reduced.

To cope with this, there has been a method for preventing a blow hole by providing an air vent hole 23 in the base material 15 as shown in FIG. 5 (see Japanese Patent Application Laid-Open No. 8-321668 and Japanese Utility Model Application Laid-Open No. 3-104773). However, in this method, the hole passing through all layers strongly constrains high-density pattern wiring. Moreover, there is the problem of entry of a solder wave from the air vent hole 23.

As another technique, there is a method for preventing a blow hole by raising the lead-inserted component 10 from the base material 15 with a silkscreen 24 and solder resist 16 to provide a groove serving as an air vent 25 as shown in FIGS. 6A and 6B (see Japanese Utility Model Application Laid-Open No. 1-171024, Japanese Patent Application Laid-Open No. 2009-295812, and Japanese Patent Application Laid-Open No. 8-204323). However, in this method, resin of the lead-inserted component 10 may soften at the time of soldering to block the air vent groove. Thus, an intended effect may not be produced.

Moreover, as still another technique, there is a method in which a spacer 27 is mounted under the lead-inserted component 10 so that the space 20 under the lead-inserted component 10 may be in an open state as shown in FIG. 7 (see Japanese Patent Application Laid-Open No. 2005-302929). A portion 28 without the spacer is in an open state to prevent the space 20 formed under the lead-inserted component 10 from becoming a hermetically closed space.

However, in this method, if the spacer 27 is thin, the space formed by the lower end of the lead-inserted component 10 and the surface of the printed wiring board (base material 15 covered with the solder resist 16) is hermetically closed due to the softening of resin of the lead-inserted component 10. Thus, an intended effect may not be produced. Conversely, if the spacer 27 is thick, a soldered position and the center of gravity of the lead-inserted component 10 are separated, and the lead 11 may be broken when the printed wiring board is subjected to an external force such as vibration.

SUMMARY OF THE INVENTION

Accordingly, an object of the present invention is to provide a leaded electronic component mounting structure in which the effect of reducing the occurrence of a blow hole is not impaired even if resin of a lead-inserted component is softened by heat during soldering and which can reduce a load placed on a lead when an external force acts.

In a leaded electronic component mounting structure according to the present invention, a leaded electronic component and a printed wiring board are electrically and mechanically joined by inserting a lead of the leaded electronic component into a through hole provided in the printed wiring board and performing immersing into molten solder. The leaded electronic component mounting structure includes a surface mount component mounted on a surface mount component pad provided on the printed wiring board and the leaded electronic component placed on the surface mount component. The surface mount component and the surface mount component pad form a tunnel-shaped air passage connecting a space formed by the leaded electronic component and the printed wiring board to an outside.

The present invention can provide a leaded electronic component mounting structure in which the effect of reducing the occurrence of a blow hole is not impaired even if resin of the lead-inserted component is softened by heat during soldering and which can reduce a load placed on a lead when an external force acts.

Moreover, in a leaded electronic component mounting structure according to the present invention, the printed wiring board includes solder resist, and the solder resist has a groove formed therein as an inlet and an outlet of the air passage. Forming the groove makes it possible to prevent the air passage from being blocked.

BRIEF DESCRIPTION OF THE DRAWINGS

These and other objects and features of the present invention will be proved from the description of embodiments below with reference to the accompanying drawings. In these drawings.

DETAILED DESCRIPTION OF THE PREFERRED EMBODIMENTS

Figure 1:
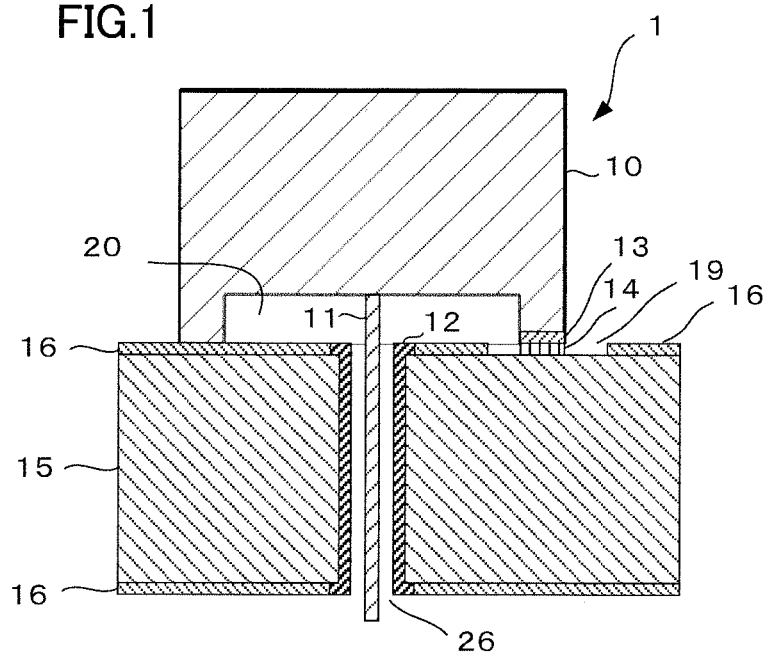
FIG. 1 is a diagram showing a printed wiring board having a lead-inserted component attached thereto before being immersed into a molten solder bath to perform soldering.

Hereinafter, embodiments of the present invention will be described with reference to drawings. It should be noted that components identical or similar to those of prior art techniques will be described using the same reference numerals.

Figure 2:
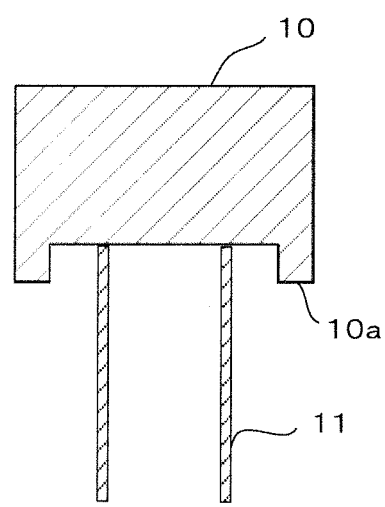
FIG. 2 is a diagram for explaining the lead-inserted component.
Figure 3A:
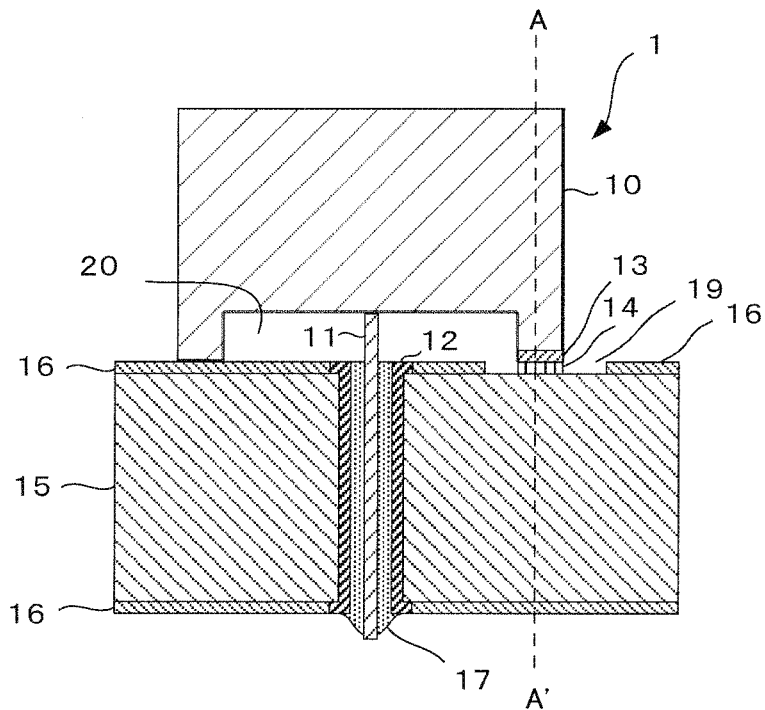
FIGS. 3A and 3B are diagrams showing a mounting structure after the printed wiring board having the lead-inserted component attached thereto is immersed into a molten solder bath to perform soldering.
Figure 3B:
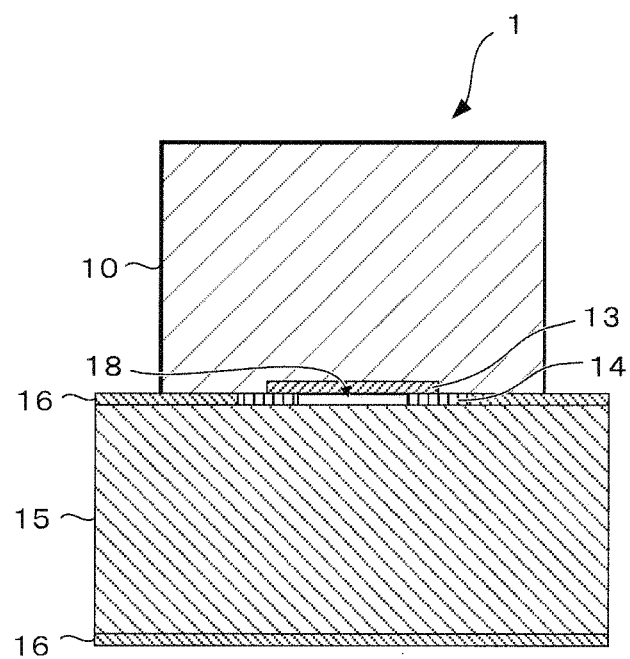
Figure 4A:
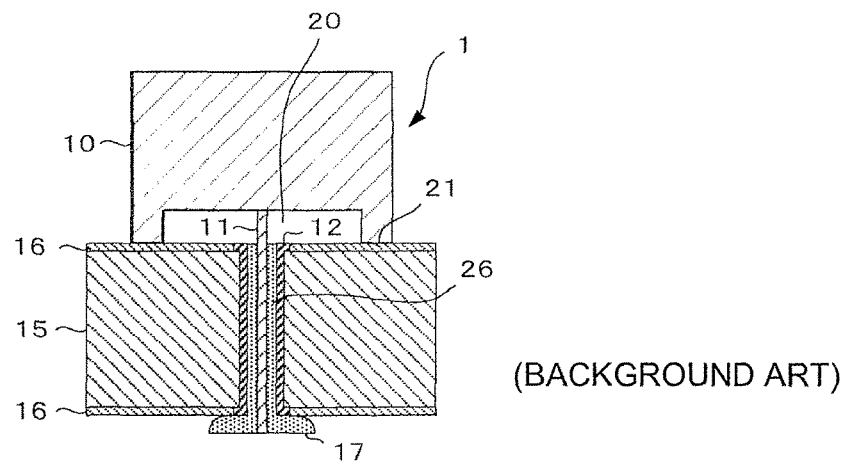
FIGS. 4A, 4B, and 4C are diagrams for explaining the mechanism of formation of a blow hole.
Figure 4B:
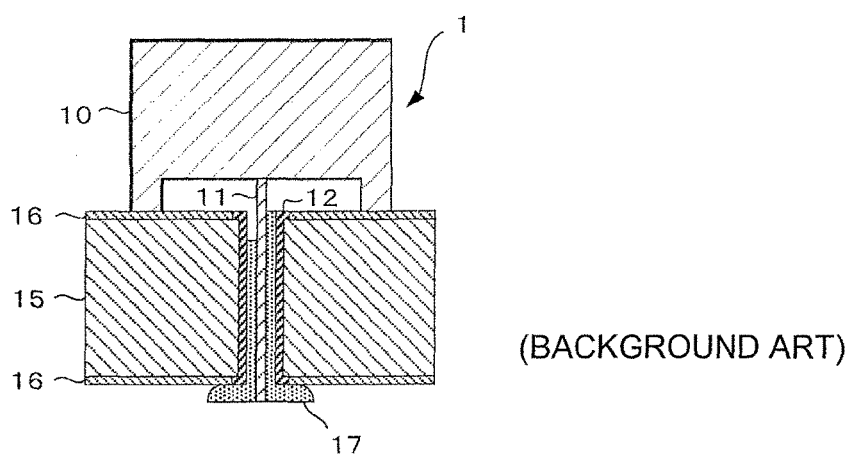
Figure 4C:
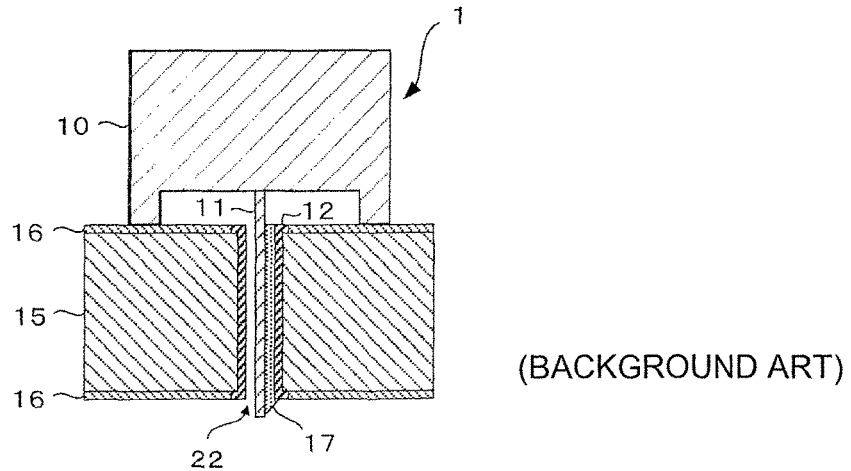
Figure 5:
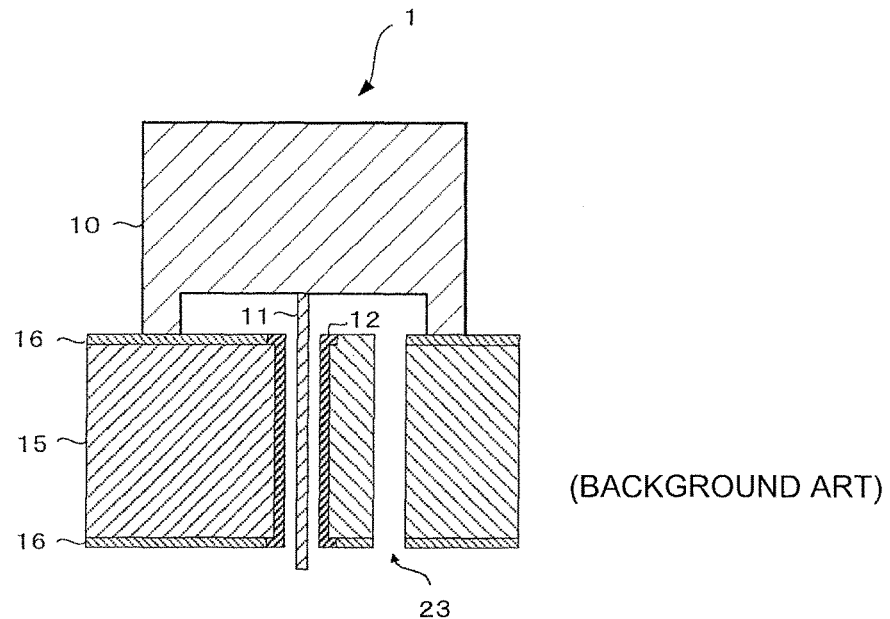
FIG. 5 is a diagram for explaining Japanese Patent Application Laid-Open No. 8-321668 and Japanese Utility Model application Laid-Open No. 3-104773.
Figure 7:
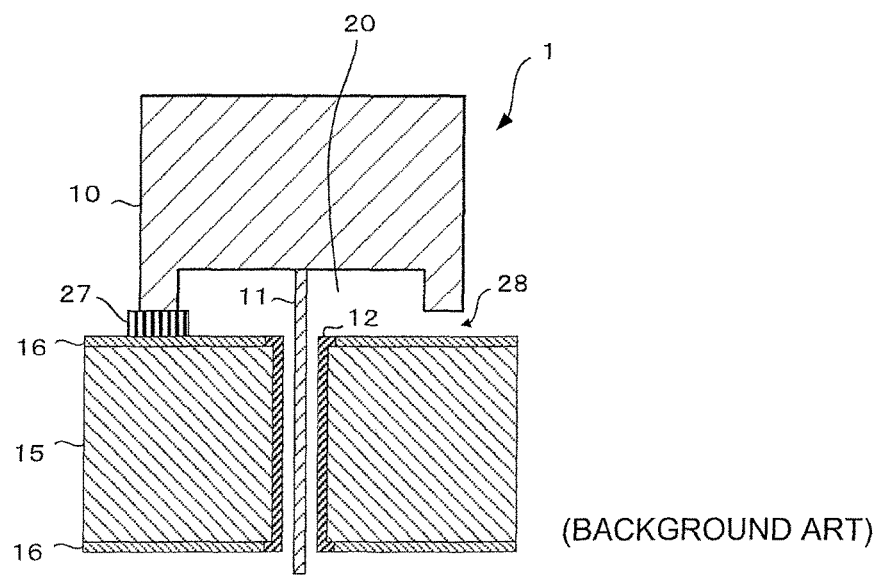
FIG. 7 is a diagram for explaining Japanese Patent Application Laid-Open No. 2005-302929.
Figure 6A:
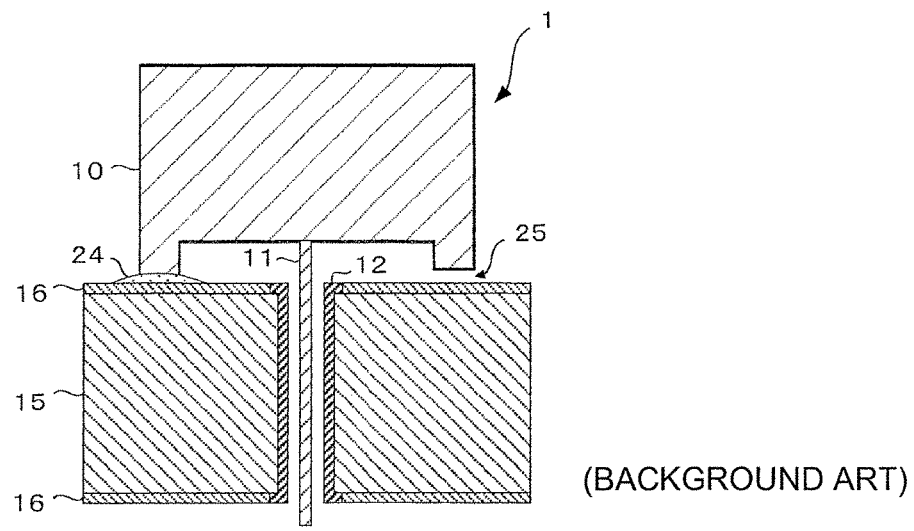
FIGS. 6A and 6B are diagrams for explaining Japanese Utility Model Application Laid-Open No. 1-171024, Japanese Patent Application Laid-Open No. 2009-295812, and Japanese Patent Application Laid-Open No. 8-204323.
Figure 6B:
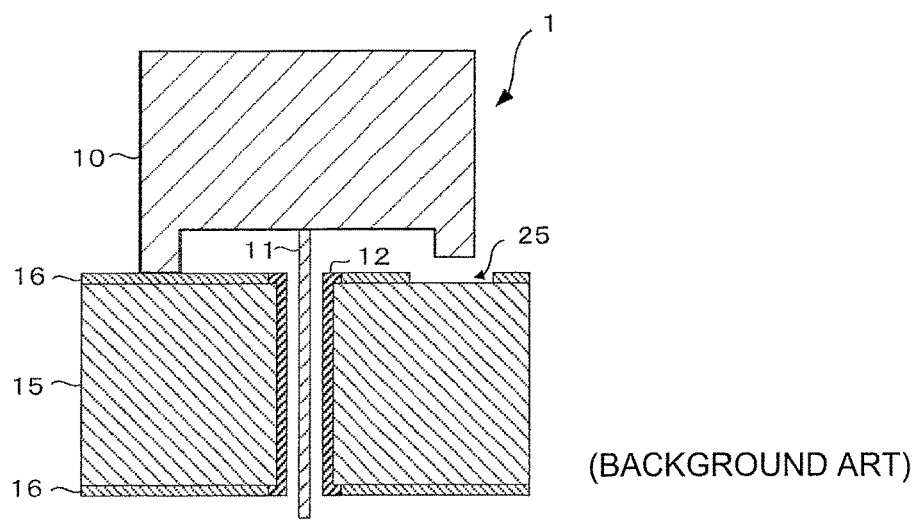

FIGS. 1, 2, 3A, and 3B are diagrams showing an embodiment of the present invention. FIG. 1 is a diagram showing a printed wiring board having a lead-inserted component attached thereto before being immersed into a molten solder bath to perform soldering. FIG. 2 is a diagram for explaining the lead-inserted component. FIGS. 3A and 3B are diagrams showing a mounting structure after the printed wiring board having the lead-inserted component attached thereto is immersed into a molten solder bath to perform soldering.

FIG. 3A is a cross-sectional view of the lead-inserted component placed on the surface mount component. FIG. 3B is another cross-sectional view which cut FIG. 3A by A-A' line. An electronic component mounting board 1 includes a lead-inserted component 10 and a printed wiring board including a base material 15 covered with solder resist 16.

As shown in FIG. 2, the lead-inserted component 10 includes leads 11 protruding from a main portion. A lower end portion 10a of the lead-inserted component 10 has the function of supporting the electronic component by contacting the printed wiring board when the lead-inserted component 10 is mounted on the printed wiring board, but non-contacting portions are also included in the lower end portion 10a of the lead-inserted component 10.

The lead-inserted component 10 used in the present invention is, for example, an electrolytic capacitor. In the present invention, the lead-inserted component 10 is mounted such that the lower end portion 10a of the lead-inserted component 10 contacts a surface of the solder resist 16 of the printed wiring board and an upper surface of a surface mount component 13.

In the printed wiring board, the base material 15 includes a conductive layer (not shown) serving as a wiring pattern and solder resist 16 which is an insulating material covering the conductive layer. The printed wiring board has through holes 26 which are electrically connected to the conductive layer and which pass from one surface of the base material 15 to other surface thereof. The through holes 26 are provided at positions to which the leads 11 of the lead-inserted component 10 are electrically and mechanically joined by soldering or the like. Embodiments of the present invention also include examples in which the printed wiring board does not include the solder resist 16.

Further, on the printed wiring board, the surface mount component 13 and surface mount component pads 14 form an air vent tunnel 18. The air vent tunnel 18 makes a space formed by the printed wiring board and the lead-inserted component 10 communicate with the outside.

The surface mount component pads 14 are formed on the base material 15 of the printed wiring board so that the lead-inserted component 10 is located over the surface mount component 13 when the surface mount component 13 soldered to the surface mount component pads 14 is mounted. At least part of the lower end portion 10a of the lead-inserted component 10 contacts the upper surface of the surface mount component 13. The surface mount component 13 is, for example, a relatively-thin chip resistor. It should be noted that in the present invention, the surface mount component 13 may be a dummy resistor which is used only to form the air vent tunnel 18.

As an inlet and an outlet of the air vent tunnel 18, a groove 19 is provided in the solder resist 16. The air vent tunnel 18 is prevented from coming into direct contact with the lead-inserted component 10 by the surface mount component 13. Accordingly, even if resin of the lead-inserted component 10 softens due to soldering, the lower end portion 10a of the lead-inserted component 10 does not lower to the air vent tunnel 18 to block the air vent tunnel 18. Thus, the effect of reducing the occurrence of a blow hole is not impaired.

Moreover, there is no need to ensure a large gap between the lower end portion 10a of the lead-inserted component 10 and the printed wiring board in order to cope with the blocking of the air vent tunnel 18 caused by the softening of resin. Accordingly, the soldered portion and the center of gravity of the lead-inserted component 10 are not separated, and increases in loads on the leads 11 of the lead-inserted component 10 can be reduced when an external force acts. Further, an increase in cost caused by a countermeasure can be reduced by using a general-purpose component as the surface mount component 13 such as a chip resistor.

While an embodiment of the present invention has been described above, the present invention is not limited to the above-described example of the embodiment, but can be carried out in other aspects by making appropriate modifications thereto.

The invention claimed is:

1. A leaded electronic component mounting structure in which a leaded electronic component and a printed wiring board are electrically and mechanically joined by inserting a lead of the leaded electronic component into a through hole provided in the printed wiring board and performing immersing into molten solder, the leaded electronic component mounting structure comprising:
    a surface mount component mounted on a surface mount component pad provided on the printed wiring board; and
    the leaded electronic component placed over the surface mount component, wherein
    the surface mount component and the surface mount component pad form a tunnel-shaped air passage connecting a space formed by the leaded electronic component and the printed wiring board to an outside, and
    the surface mount component prevents the tunnel-shaped air passage from coming into contact with the leaded electronic component.

2. The leaded electronic component mounting structure according to claim 1, wherein
    the printed wiring board includes solder resist, and
    the solder resist has a groove formed therein as an inlet and an outlet of the air passage.

\* \* \* \* \*